United States Patent
Brooks et al.

[19]

[11] Patent Number: 6,146,922
[45] Date of Patent: *Nov. 14, 2000

[54] HYBRID FRAME WITH LEAD-LOCK TAPE

[75] Inventors: Jerry M. Brooks, Caldwell; Larry D. Kinsman; Timothy J. Allen, both of Boise, all of Id.

[73] Assignee: Micron Technology, Inc., Boise, Id.

[*] Notice: This patent is subject to a terminal disclaimer.

[21] Appl. No.: 09/243,887

[22] Filed: Feb. 3, 1999

Related U.S. Application Data

[60] Continuation of application No. 08/914,718, Aug. 19, 1997, Pat. No. 5,897,340, which is a division of application No. 08/681,885, Jul. 29, 1996, Pat. No. 5,717,246.

[51] Int. Cl.⁷ .......................... H01L 21/44; H01L 21/48; H01L 21/50
[52] U.S. Cl. ........................ 438/123; 438/106; 438/121
[58] Field of Search ...................... 438/123, 121, 438/106

[56] References Cited

U.S. PATENT DOCUMENTS

| | | |
|---|---|---|
| 4,033,844 | 7/1977 | Pantiga et al. . |
| 4,089,733 | 5/1978 | Zimmerman . |
| 4,279,682 | 7/1981 | Hamagami et al. . |
| 4,801,999 | 1/1989 | Hayward et al. . |
| 4,835,120 | 5/1989 | Mallik et al. . |
| 4,862,245 | 8/1989 | Pashby et al. . |
| 4,891,687 | 1/1990 | Mallik et al. . |
| 4,894,752 | 1/1990 | Murata et al. . |
| 4,984,059 | 1/1991 | Kubota et al. . |
| 4,989,068 | 1/1991 | Yasuhara et al. . |
| 5,068,714 | 11/1991 | Seipler . |
| 5,140,404 | 8/1992 | Fogal et al. . |
| 5,142,450 | 8/1992 | Olson et al. . |
| 5,184,208 | 2/1993 | Sakuta et al. . |
| 5,218,229 | 6/1993 | Farnworth . |
| 5,227,661 | 7/1993 | Heinen . |
| 5,227,662 | 7/1993 | Ohno et al. . |
| 5,231,755 | 8/1993 | Emanuel . |
| 5,233,220 | 8/1993 | Lamson et al. . |
| 5,252,853 | 10/1993 | Michii . |
| 5,286,679 | 2/1994 | Farnworth et al. . |
| 5,304,842 | 4/1994 | Farnworth et al. . |
| 5,331,200 | 7/1994 | Teo et al. . |
| 5,331,201 | 7/1994 | Nishino . |
| 5,352,633 | 10/1994 | Abbott . |
| 5,378,657 | 1/1995 | Lin . |
| 5,396,701 | 3/1995 | Russell . |
| 5,418,189 | 5/1995 | Heinen . |
| 5,461,255 | 10/1995 | Chan et al. . |
| 5,466,888 | 11/1995 | Beng et al. . |
| 5,471,369 | 11/1995 | Honda et al. . |
| 5,475,918 | 12/1995 | Kubota et al. . |
| 5,535,509 | 7/1996 | Tomita et al. . |
| 5,589,420 | 12/1996 | Russell . |
| 5,717,246 | 2/1998 | Brooks et al. ............... 257/666 |
| 5,897,340 | 9/1999 | Brooks et al. ............... 438/123 |

FOREIGN PATENT DOCUMENTS

| | | |
|---|---|---|
| 0576021 | 12/1993 | European Pat. Off. . |
| 60-105658 | 2/1974 | Japan . |
| 2156547 | 12/1988 | Japan . |
| 335589 | 6/1989 | Japan . |

OTHER PUBLICATIONS

Caroline A. Kovac et al.; "Plastic Package Fabrication"; pp. 470–482.

Louis T. Manzione; "Plastic Packaging of Microelectronic Devices"; 1990; pp. 156–161, 168–173, 186–189, 194–199, 212–215, 224–229, 302–303 and 346–347.

*Primary Examiner*—Kevin M. Picardat
*Assistant Examiner*—D. M. Collins
*Attorney, Agent, or Firm*—Trask Britt

[57] ABSTRACT

A hybrid lead frame having leads for conventional lead-to-I/O wire bonding, and leads for power and ground bussing that extend over a surface of the semiconductor die is provided where the leads for bussing are held in place by lead-lock tape to prevent bending and/or other movement of the bussing leads during manufacturing. More specifically, the lead-lock tape is transversely attached across a plurality of bussing leads proximate to and outside of the position where the die is to be attached.

40 Claims, 8 Drawing Sheets

HYBRID FRAME WITH LEAD-LOCK TAPE

CROSS REFERENCE TO RELATED APPLICATIONS

This application is a continuation of 08/914,718, filed Aug. 19, 1997, U.S. Pat. No. 5,897,340, which is a divisional of 08/681,885, filed Jul. 29, 1996, now U.S. Pat. No. 5,717,246.

BACKGROUND OF THE INVENTION

1. Field of the Invention

This invention relates generally to lead frames used for electrical connection to a semiconductor die. More specifically, this invention relates to a hybrid lead frame having both leads for conventional lead-to-die wire bonding and leads for power and ground bussing that extend over a surface of the semiconductor die. In particular, the bussing leads are held in place by lead-lock tape to prevent bending and/or other movement of the bussing leads during manufacturing.

2. State of the Art

Dynamic Random Access Memory (DRAM) devices are the most widely used type of memory device. The amount of single-bit addressable memory locations within each DRAM is increasing along with the need for greater memory part densities. This demand for greater memory densities has created a global market and has resulted in memory part standards in which many memory parts are regarded as fungible items. Thus, many memory parts operate according to well known and universally adopted specifications such that one manufacturer's memory part is plug-compatible with another manufacturer's memory part.

In prior art packages, the power and ground pins are typically located along the longitudinal edges of the chip. Moreover, in prior art multiple metal layer DRAM designs, the power is brought to the interior of the die by on-chip metal interconnects connecting the peripheral power bonding pads to the on-chip power buses for distribution. This requires that the $V_{cc}$ (power) and the $V_{ss}$ (ground) buses have their metal interconnect paths go over or under one another on the die.

Accordingly, the parent application to this invention provides a solution to the need in the art to produce memory parts which can fit within the packaging requirements of previous generations of memory parts. This need for "plug-compatible upgrades" requires that memory density upgrades are easy to effect in existing computer systems and other systems which use memory, such as video systems. This requires that greater density memory parts be placed within the same size packages as previous generations of memory parts with the same signal and power pinout assignments.

As part of this need for plug compatible upgrades is the need to be able to use existing chip production equipment to manufacture such plug compatible upgrades. That is, because of this need to manufacture similarly configured devices, in addition to the large capital expenditure of purchasing new equipment for successive products and the long lead time for setting up and manufacturing products from such equipment, there is a further need in the art to either modify existing equipment or, better yet, to modify the substructure of the product to be adaptable to manufacture on existing equipment. There is still a further need in the art to more efficiently manufacture CMOS dynamic random access semiconductor memory parts which utilize space-saving techniques to fit the most memory cells within a fixed die size using a single deposition layer of highly conductive interconnect. This need also includes manufacturing such memory parts in a shorter production time using fewer process steps to produce more competitively priced memory parts.

The resulting solution, as presented in the parent application to this invention, provides a chip/lead frame configuration having a conventional lead finger arrangement with LOC bussing leads so that both the lead fingers and bussing leads can be wire bonded to bond pads on a semiconductor chip without having the wire bonds cross over any other lead. This chip/lead frame configuration can be produced on existing chip manufacturing equipment, resulting in a semiconductor device that is plug compatible in conventional computer equipment. Because of the unique lead frame configuration, however, developed to address the above-identified needs, at least one difficulty has been foreseen during manufacturing. That is, it is difficult to maintain the bussing leads of the present invention from bending, flexing, and/or otherwise moving during the manufacturing process.

The use of LOC-type bussing leads is known in the art to provide the chip with power and ground leads near the bonding pads of the chip. Typically, however, these LOC bussing leads are used in conjunction with a LOC lead frame. Examples of such LOC configurations with LOC bussing leads are shown in U.S. Pat. No. 4,862,245 to Pashby and U.S. Pat. No. 5,286,679 to Farnworth et al., assigned to the assignee of the present invention. As illustrated in U.S. Pat. No. 5,331,200 to Teo et al., it has also been recognized in the art to provide LOC bussing leads that include lead fingers for LOC bonding of the bussing leads to the chip without the use of wire bonds. Similarly, in U.S. Pat. No. 5,252,853 to Michii, the bus bars are bonded directly to the power and ground bond pads of the semiconductor chip.

Because of the relatively small size and the delicate nature of the individual lead fingers of high pin count lead frames, the need to stabilize the leads during the manufacturing process has been recognized in the art. For example, in U.S. Pat. No. 5,352,633 a plastic material is applied to the leads for retaining them in a common plane. In addition, as described in U.S. Pat. No. 5,140,404 to Fogal et al. and assigned to the assignee of the present invention, a nonconductive plastic or polyamide carrier material supporting a layer of thermoplastic is attached to the leads of a lead frame and provides support for a semiconductor die.

Applying a material, such as a tape, to the leads of a lead frame, as described in the art, to hold the leads in relative position to one another is not sufficient to keep the bus bars of the lead frame of the present invention from flexing, bending and/or moving relative to one another during the manufacturing process. Thus, it would be advantageous to provide a structure and method for securing the bus bars in position during the manufacturing process.

SUMMARY OF THE INVENTION

In a preferred embodiment of the parent application, a memory device having at least 16 megabytes ($2^{24}$ bits) is uniquely formed in which highly conductive interconnects (such as metal) are deposited in a single deposition step. The invention is described in reference to an exemplary embodiment of a 16 megabyte Dynamic Random Access Memory in which only a single deposition layer of highly conductive interconnects are deposited in a single deposition step. The resulting semiconductor die or chip can be manufactured with existing production equipment and fits within an existing industry-standard 300 mil Small Outline J-wing (SOJ), Thin, Small Outline Package (TSOP) or other industry standard packages with little or no speed loss over previous double metal deposition layered 16 megabyte DRAM physical architectures. This is accomplished using a die orientation that allows for a fast, single metal speed path, together with the novel use of a lead frame to remove a substantial portion of the power bussing from the single deposition layer metal, allowing for a smaller speed-optimized DRAM. The use of a single deposition layer metal design results in lower production costs and shorter production time for a wide variety of memory parts, including, but not limited to, DRAM, SRAM, VRAM, SAM, and the like.

According to the present invention, a structure and method for securing the bus bars of the hybrid lead frame disclosed in the parent application are provided. More specifically, this invention provides at least one tape segment or other similar structure comprised of a nonconductive plastic, or other similar material as known in the art, across the bussing leads of the hybrid lead frame. The tape segment is preferably positioned between at least two bus bars proximate the edge of the location where the semiconductor die is to be positioned.

The tape segments of the present invention help maintain the bussing leads in relative position during the manufacturing process and keep the bussing leads from flexing, bending and/or otherwise moving relative to each other and the plane defined by the top surface of the bussing leads.

The present invention solves the above-mentioned needs in the art and other needs which will be understood by those skilled in the art upon reading and understanding the present specification.

DETAILED DESCRIPTION OF THE ILLUSTRATED EMBODIMENT

Figure 1:
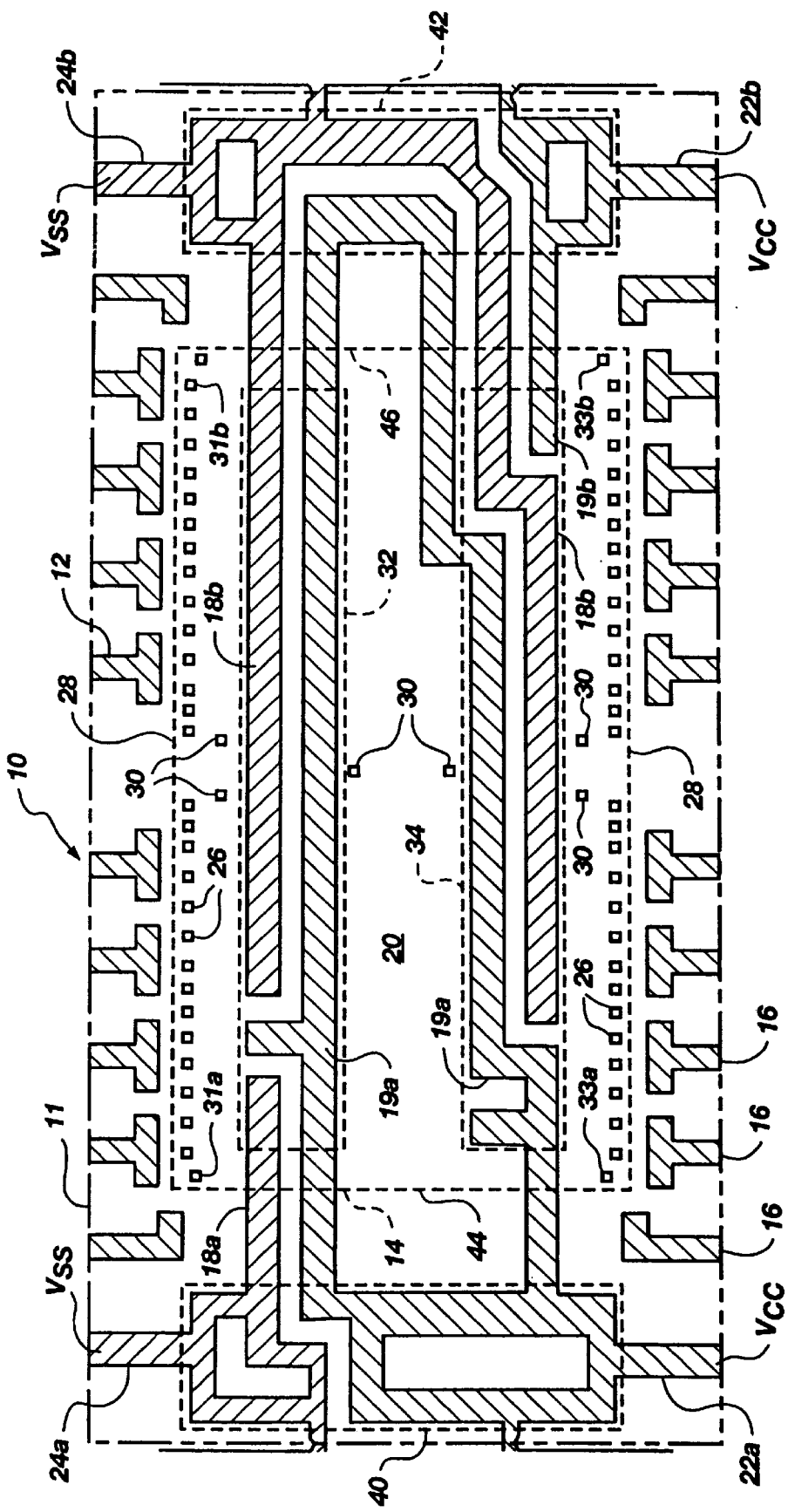
FIG. 1 is a schematic drawing of a first embodiment of a lead frame and a first embodiment of attached tape segments in accordance with the present invention.

As illustrated in FIG. 1, the memory device 10 according to the present invention is comprised of a lead frame 12 and a semiconductor die or chip (represented by dashed line 14). A semiconductor device 10, manufactured according to the present invention is plug compatible with existing memory parts known in the art. Dashed line 11 represents that portion of the memory device 10 that is encapsulated to form a packaged semiconductor device. The lead frame 12 includes a plurality of lead fingers 16 (denoted with cross-hatching) that extends proximate the semiconductor die 14 and a plurality of bussing leads or bus bars 18a, 18b, 19a, and 19b (denoted with hatching) that substantially longitudinally extends over the active surface 20 of the semiconductor die 14. The bus bars include both $V_{cc}$ (power) and $V_{ss}$ (ground) connections 22a, 22b, 24a and 24b, respectively, for providing both power and ground to the internal circuitry of the semiconductor die 14.

The semiconductor die 14 includes a plurality of contact or bond pads 26 proximate the periphery 28 of the active surface 20 of the semiconductor die 14. The restriction of using a single deposition layer metal of interconnect and the restriction in the die size require that at least some of the power distribution be performed off-chip. This is accomplished by placing some power bonding pads 30 in the interior regions of the semiconductor die 14 and using the lead frame 12 according to the present invention that extends over the active surface 20 of the semiconductor die.

In the present invention, the lead frame 12 allows the $V_{cc}$ and $V_{ss}$ to be distributed from within the interior regions of the semiconductor die without the need for on-chip power buses to go over or under one another. The lead frame buses 22a, 22b, 24a, and 24b are insulated from touching the top of the die by a polyamide die coat and two insulating tape strips 32 and 34 (represented by dashed lines). The primary function of the insulating tape strips 32 and 34 is to provide a mechanical backing for the metal traces of the lead frame. The insulating tape strips 32 and 34 also help support the semiconductor die 14 relative to the lead frame 12. Since power buses 22a, 22b for $V_{cc}$ and the ground buses 24a and 24b for $V_{ss}$ are located over the active surface 20 of the semiconductor die 14, the buses 22a, 22b, 24a, and 24b are wire bonded to the interior bonding pads 30 and corner bonding pads 31a, 31b, 33a and 33b to complete the power and ground distribution. It should be noted that there are more bonding pads indicated on the semiconductor die 14 than lead fingers 16 of the lead frame 12 since multiple wire bonds may be made from bonding pads to the lead frame for I/O signals.

Despite the bus bars 18a, 18b, and 19a being held in relative position by insulating tape 32 and bus bars 19a, 19b, and 18b being held in relative position by insulating tape 34, some flexing, bending and other movement of the bus bars relative to one another and the semiconductor die 14 may occur during manufacturing. Because the position of components during the manufacturing process is so important, any such movement is not only undesirable, but can result in the manufacture of a faulty component. To further support the bus bars 18a, 18b, 19a, and 19b relative to one another, transversely extending tape segments 40 and 42 (represented by dashed lines) are provided proximate the ends 44 and 46 of the semiconductor die 14, respectively. These tape segments 40 and 42 are positioned just inside the outside of the package 11 and secure at least two bus bars relative to each other. As illustrated, the bus bars 18a, 18b, 19a, and 19b each are variously configured to provide a larger surface area of each bus bar 18a, 18b, 19a, and 19b for attachment to the tape segments 40 and 42. However, if only one bus bar is provided extending over the semiconductor die 14, the tape segments 40 and 42 may secure the one bus bar relative to the lead frame 12.

Figure 2:
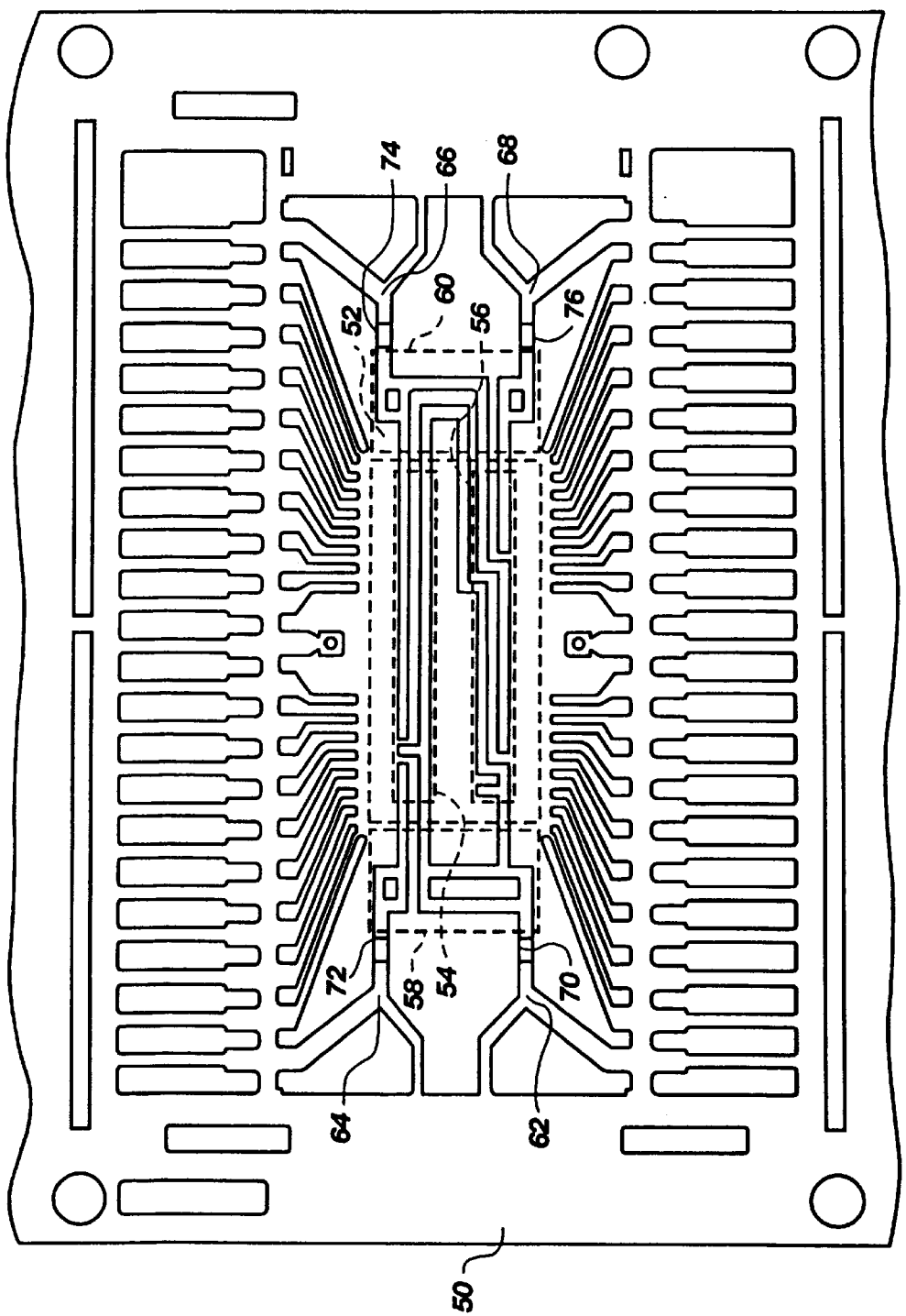
FIG. 2 is a schematic drawing of a second embodiment of a lead frame and a second embodiment of attached tape segments in accordance with the present invention.

Referring to FIG. 2, a second preferred embodiment of a lead frame 50 in accordance with the present invention is shown. The lead frame 50 is part of a plurality of substantially identical lead frames 50, each formed from a single piece of sheet metal, forming a lead frame strip as is known in the art. The lead frame 50 is substantially similar to the lead frame 12 shown in FIG. 1 and is configured to receive a semiconductor die 52, two substantially longitudinally extending tape segments 54 and 56, and two substantially transversely extending tape segments 58 and 60. As in FIG. 1, the tape segments 58 and 60 support the bus bars 62, 64, 66, and 68 by securing the bus bars 62, 64, 66, and 68 relative to one another. In this embodiment, the tape segments 58 and 60 longitudinally extend from proximate the semiconductor die 52 to a first bend 70, 72, 74, and 76 of each bus bar 62, 64, 66, and 68, respectively. As previously stated, if only one bus bar is provided extending over the semiconductor die 52, the tape segments 58 and 60 may secure the bus bar in position relative to the lead frame 50.

Figure 3A:
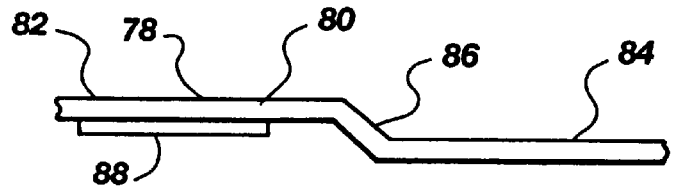
FIGS. 3a–3d are schematic side view drawings showing four preferred embodiments of the positioning of a tape segment relative to a bus bar according to the present invention.
Figure 3B:
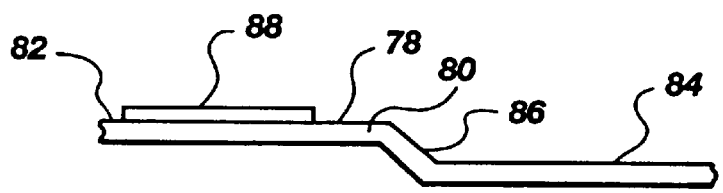
Figure 3C:
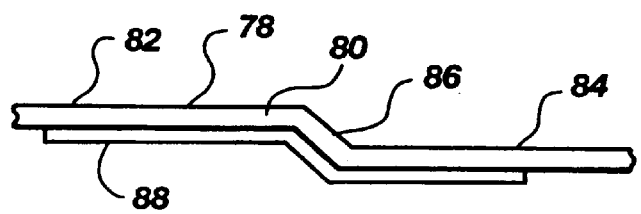
Figure 3D:
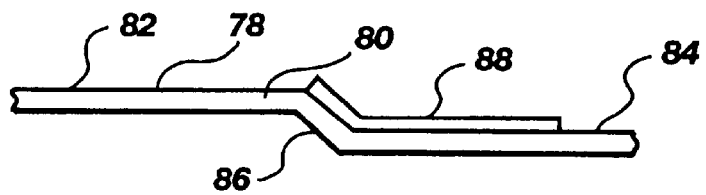

As illustrated in FIGS. 3a–3d, top surface 78 of the bus bars, represented by bus bar 80, defines at least two portions 82 and 84. The second portion 84 is in substantial alignment with a plane defined by the top surface of the rest of the lead frame. A tape segment 88 may be may be placed beneath the bus bar 80 along a segment of the first portion 82 as shown in FIG. 3a, above the bus bar 80 as shown in FIG. 3b, beneath the bus bar 80 extending along both the first and second portions 82 and 84 as shown in FIG. 3c, above the bus bar 80 along the second portion 84 and the angled portion 86 as shown in FIG. 3d, or any combination thereof including multiple tape segments 88 both above and beneath the bus bar 80.

Figure 4:
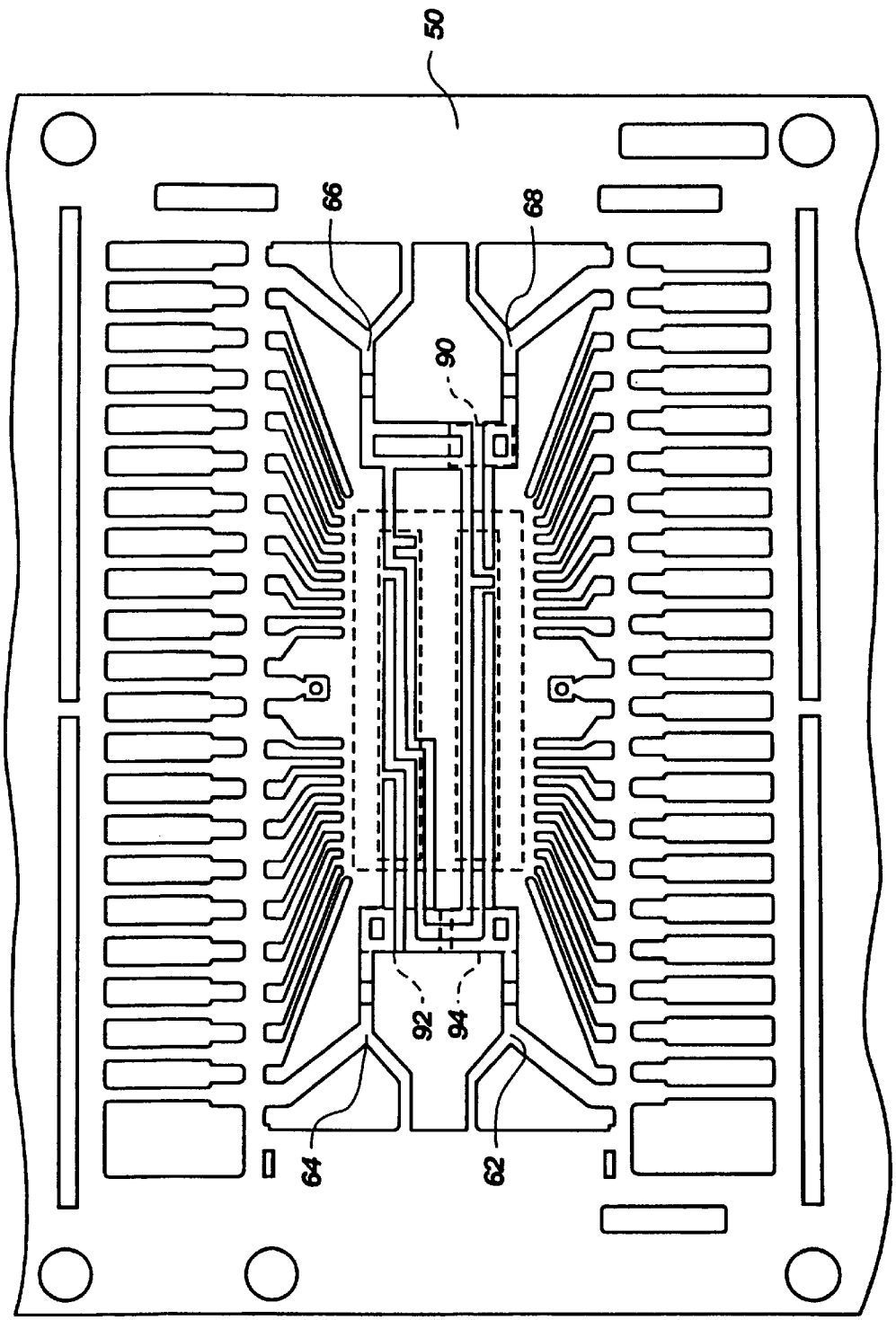
FIG. 4 is a schematic drawing of the lead frame shown in FIG. 2 and a third embodiment of attached tape segments in accordance with the present invention.
Figure 5:
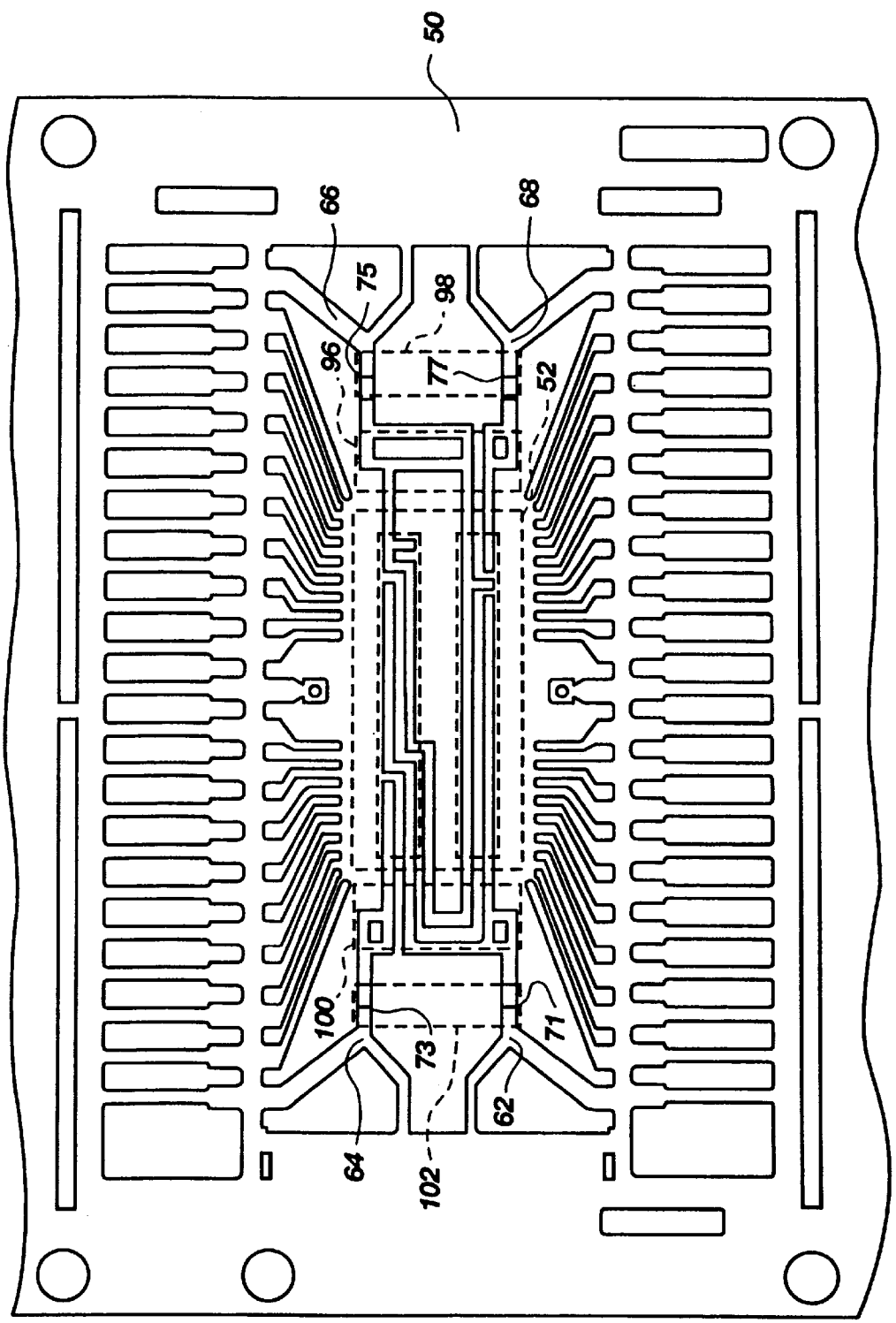
FIG. 5 is a schematic drawing of the lead frame shown in FIG. 2 and a fourth embodiment of attached tape segments in accordance with the present invention.

FIGS. 4 and 5 illustrate the lead frame 50 shown in FIG. 2 with variously configured tape segments. For example, in FIG. 4, the bus bars 66 and 68 are held in relative position to one another by a tape segment 90 smaller than the tape segment 60 illustrated in FIG. 2. Likewise, bus bars 62 and 64 are held in relative position by tape segment 92. An additional tape segment 94 may also be used to secure bus bar 62 to bus bar 66. In FIG. 5, the bus bars 66 and 68 are secured by two tape segments 96 and 98, one tape segment 96 positioned proximate the semiconductor die 52 and the other tape segment 98 positioned across the second bends 75 and 77. Similarly, the tape segments 100 and 102 secure bus bars 62 and 64 with tape segment 100 positioned proximate the semiconductor die 52 and tape segment 102 positioned across the second bends 71 and 73.

Figure 6:
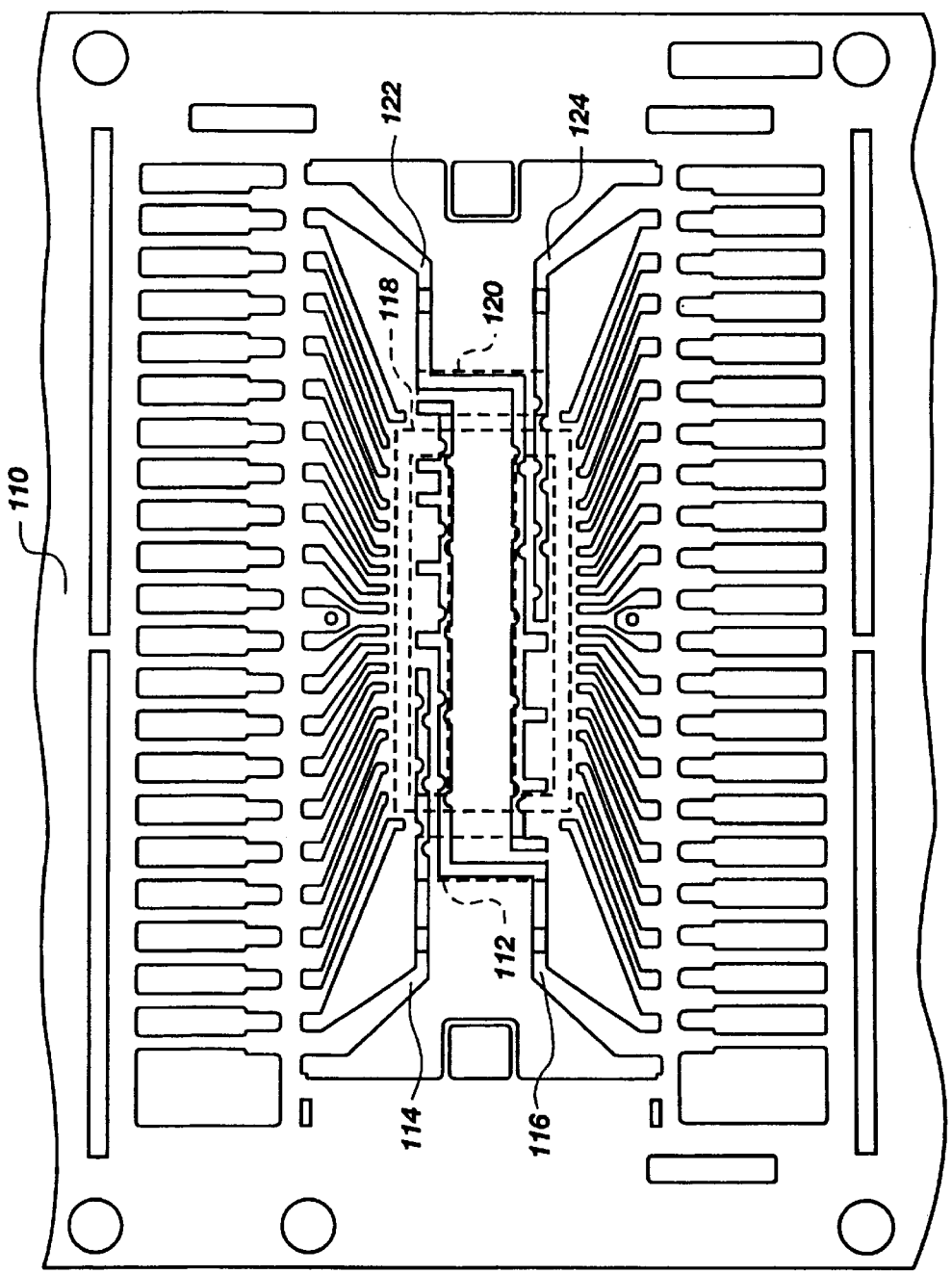
FIG. 6 is a schematic drawing of a third embodiment of a lead frame and a fifth embodiment of attached tape segments in accordance with the present invention.
Figure 7:
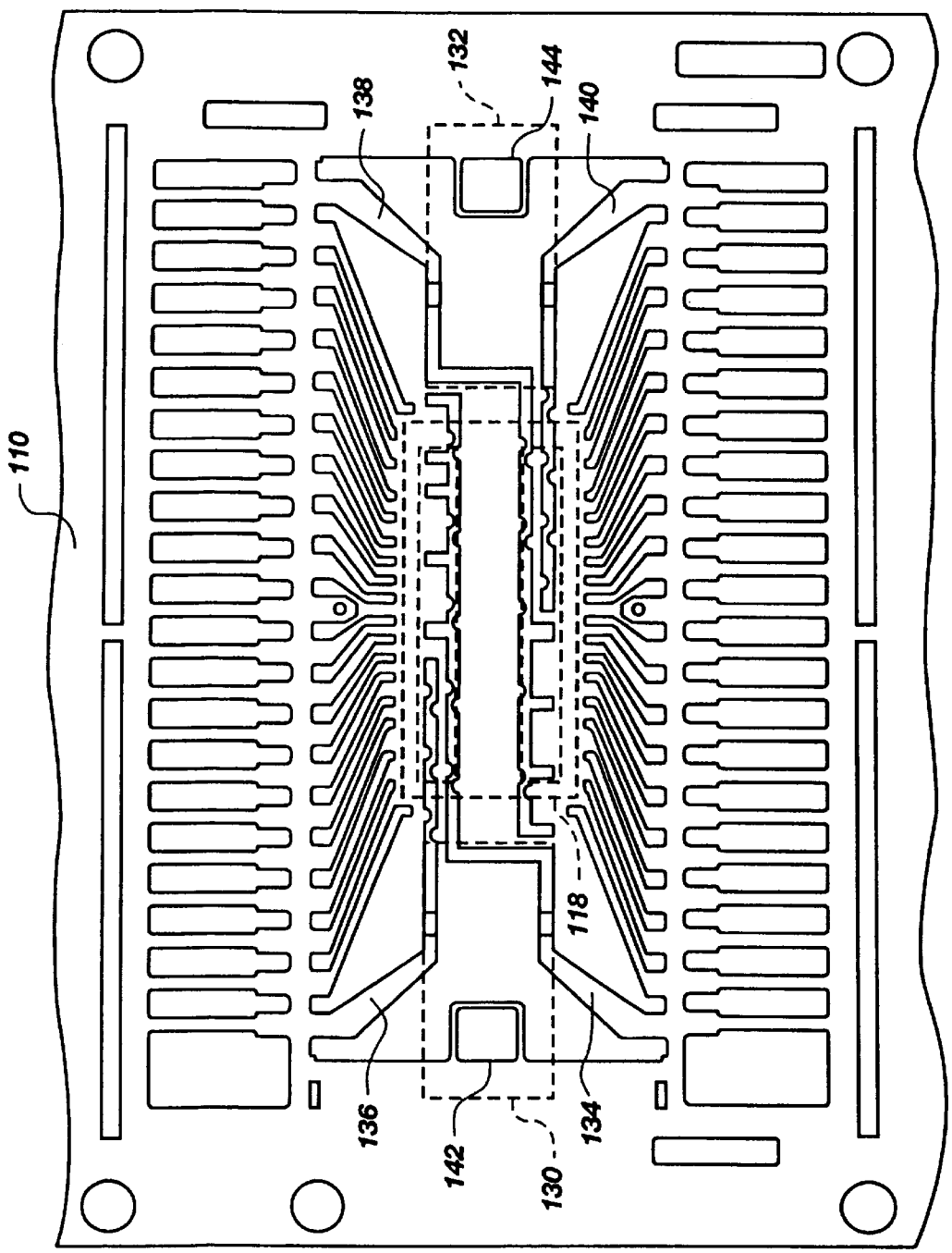
FIG. 7 is a schematic drawing of the lead frame shown in FIG. 6 and a sixth embodiment of attached tape segments in accordance with the present invention.
Figure 8:
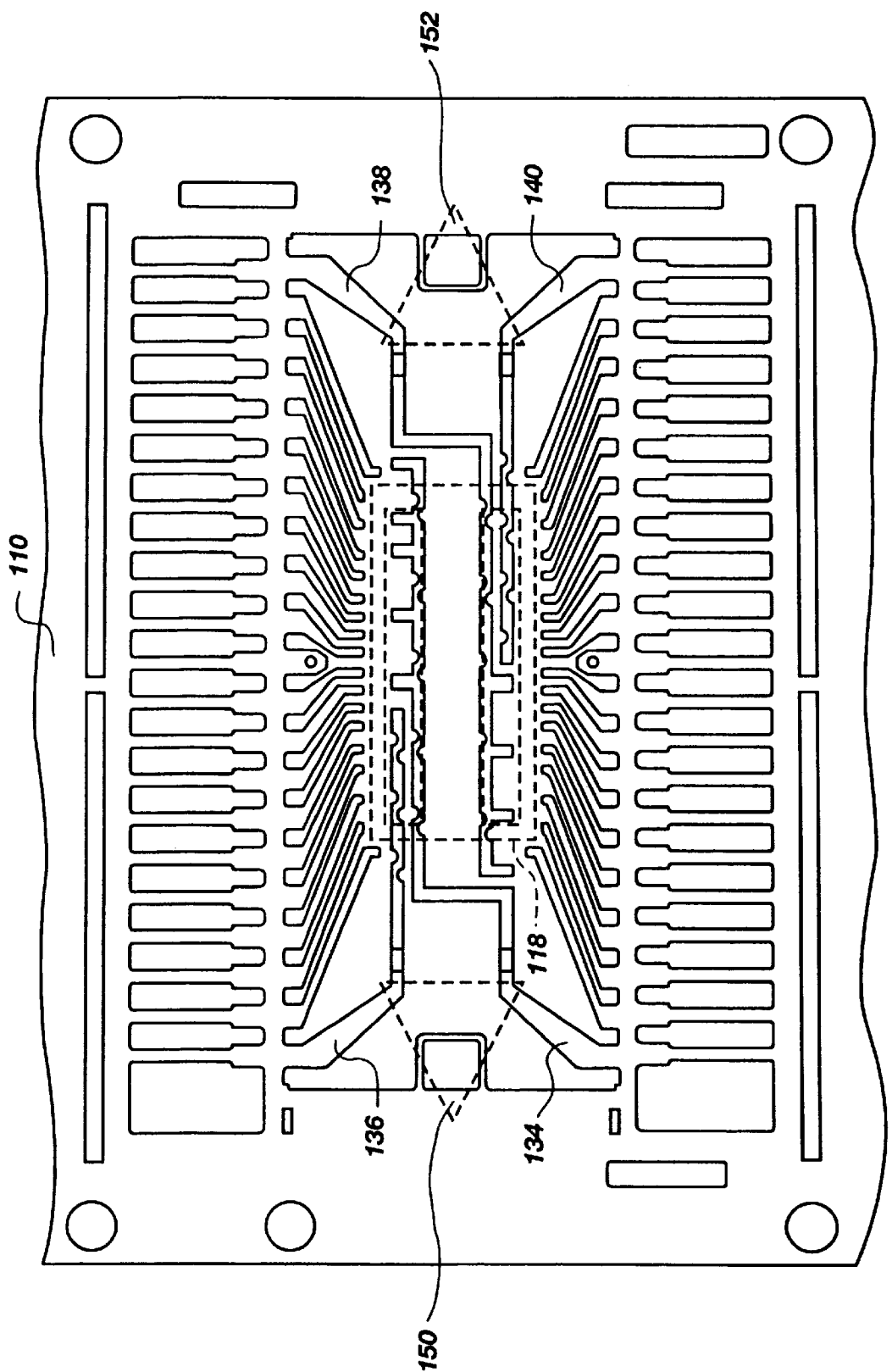
FIG. 8 is a schematic drawing of the lead frame shown in FIG. 6 and a seventh embodiment of attached tape segments in accordance with the present invention.

FIGS. 6, 7, and 8 illustrate another preferred embodiment of a lead frame 110 according to the present invention. As shown in FIG. 6, the substantially transversely extending tape segment 112 may extend across the bus bars 114, 116, and 122 and the tape segment 120 across bus bars 122, 124, and 116, each proximate the semiconductor die 118. FIG. 7 illustrates that the size of the tape segments 130 and 132 may be enlarged to not only transversely extend across the bus bars 134, 136, 138, and 140, but may also longitudinally extend a substantial distance along the lead frame 110 to reach the inside edges 142 and 144 of the lead frame 110 and provide additional support to the bus bars 134, 136, 138, and 140. Finally, FIG. 8 illustrates that, unlike the substantially rectangular tape segments of the previous embodiments, the tape segments 150 and 152 may have various configurations such as the triangular tape segments 150 and 152 as shown. Those skilled in the art will recognize that other shapes and sizes of tape segments may be used to stabilize one or more of the bus bars of the lead frame whether rectangular, circular, oval, or other symmetric or asymmetric shapes.

Those skilled in the art will also appreciate that the number and/or configuration of tape segments, whether placed above or below the lead frame, may vary according to design parameters without departing from the spirit of the present invention. Further, the term "tape", as used herein, is intended as exemplary and not limiting, the invention having applicability to any supportive structure securing at least two of the bussing leads together. Moreover, although this invention has been described with respect to plastic tapes and the like, those skilled in the art will appreciate this invention's applicability to tape manufactured from other suitable materials. Additionally, those skilled in the art will appreciate that there may be other lead frames where this invention may have applicability, such as some LOC, conventional and hybrid lead frames. It will also be appreciated by one of ordinary skill in the art that one or more features of any of the illustrated embodiments may be combined with one or more features from another to form yet another combination within the scope of the invention as described and claimed herein. Thus, while certain representative embodiments and details have been shown for purposes of illustrating the invention it will be apparent to those skilled in the art that various changes in the invention disclosed herein may be made without departing from the scope of the invention, which is defined in the appended claims.

What is claimed is:

1. A method of manufacturing a semiconductor device, comprising:

forming a lead frame having a plurality of inwardly extending leads, said plurality of inwardly extending leads defining a die position, having a first and second end, and having at least one substantially longitudinally extending bussing lead between said first end and said second end of said lead frame and across at least a portion of said die position, said at least one substantially longitudinally extending bussing lead formed to have at least one intermediate angled portion; and attaching at least one tape segment between said at least one substantially longitudinally extending bussing lead and a portion of said lead frame.

2. The method of claim 1, further including:

maintaining said at least one substantially longitudinally extending bussing lead in position relative to said lead frame by securing said at least one substantially longitudinally extending bussing lead with said at least one tape segment.

3. The method of claim 1, further including:

providing a semiconductor die having a plurality of bond pads on an active surface thereof and positioning said semiconductor die relative to said lead frame at said die position.

4. The method of claim 3, further including:

attaching said semiconductor die to said at least one bussing lead at said die position.

5. The method of claim 4, further including:

attaching said semiconductor die to said at least one substantially longitudinally extending bussing lead by adhesively attaching said semiconductor die to said at least one substantially longitudinally extending bussing lead.

6. The method of claim 5, further including:

attaching said semiconductor die to said at least one substantially longitudinally extending bussing lead by providing at least one longitudinally extending tape segment between said at least one substantially longitudinally extending bussing lead and said semiconductor die.

7. The method of claim 6, further including:

wire bonding a plurality of said plurality of inwardly extending leads to a plurality of said plurality of bond pads.

8. The method of claim 7, further including:

wire bonding said at least one substantially longitudinally extending bussing lead to a plurality of said plurality of bond pads.

9. The method of claim 8, further including:

packaging at least a portion of said plurality of inwardly extending leads and said semiconductor die.

10. The method of claim 9, further including:

attaching a plurality of said plurality of inwardly extending leads to a circuit of a computer.

11. A method of manufacturing a semiconductor device connected to a hybrid lead frame, said method comprising the steps of:

forming a hybrid lead frame having a plurality of inwardly extending leads, said plurality of inwardly extending leads defining a die position, having a first and second end and having at least one substantially longitudinally extending bussing lead between said first end and said second end of said lead frame and across at least a portion of said die position, said at least one substantially longitudinally extending bussing lead formed to have at least one intermediate angled portion; and attaching at least one tape segment between said at least one substantially longitudinally extending bussing lead and a portion of said hybrid lead frame.

12. The method of claim 11, further including:

maintaining said at least one substantially longitudinally extending bussing lead in relative position to said hybrid lead frame by securing said at least one substantially longitudinally extending bussing lead with said at least one tape segment.

13. The method of claim 11, further including:

providing a semiconductor die having a plurality of bond pads on an active surface thereof; and positioning said semiconductor die relative to said lead frame at said die position.

14. The method of claim 13, further including:

attaching said semiconductor die to said at least one substantially longitudinally extending bussing lead at said die position.

15. The method of claim 14, further including:

attaching said semiconductor die to said at least one substantially longitudinally extending bussing lead by adhesively attaching said semiconductor die thereto.

16. The method of claim 15, further including:

attaching said semiconductor die to said at least one substantially longitudinally extending bussing lead by providing at least one longitudinally extending tape segment between said at least substantially longitudinally extending one bussing lead and said semiconductor die.

17. The method of claim 16, further including:

wire bonding a plurality of said plurality of inwardly extending leads to a plurality of said plurality of bond pads.

18. The method of claim 17, further including:

wire bonding said at least one substantially longitudinally extending bussing lead to a plurality of said plurality of bond pads.

19. The method of claim 18, further including:

packaging at least a portion of said plurality of inwardly extending leads and said semiconductor die.

20. The method of claim 19, further including:

attaching a plurality of said plurality of inwardly leads to a circuit of a computer.

21. A method of manufacturing a semiconductor device, comprising:

forming a lead frame having a plurality of inwardly extending leads, said plurality of inwardly extending leads defining a die position, having a first and second end and having a plurality of substantially longitudinally extending bussing leads between said first end and said second end of said lead frame and across at least a portion of said die position, at least one of said plurality of substantially longitudinally extending bussing leads formed to have at least one intermediate angled portion; and attaching at least one tape segment between at least two of said plurality of substantially longitudinally extending bussing leads proximate distal ends of said at least two of said plurality of substantially longitudinally extending bussing leads.

22. The method of claim 21, further including:

maintaining said plurality of substantially longitudinally extending bussing leads in position relative to each other by securing said plurality of substantially longitudinally extending bussing leads with said at least one tape segment.

23. The method of claim 22, further including:

providing a semiconductor die having a plurality of bond pads on an active surface thereof; and positioning said semiconductor die relative to said lead frame at said die position.

24. The method of claim 23, further including:

attaching said semiconductor die to said plurality of substantially longitudinally extending bussing leads at said die position.

25. The method of claim 24, further including:

attaching said semiconductor die to said plurality of substantially longitudinally extending bussing leads by adhesively attaching said semiconductor die to said plurality of substantially longitudinally extending bussing leads.

26. The method of claim 25, further including:

attaching said semiconductor die to said plurality substantially longitudinally extending of bussing leads by providing at least one longitudinally extending tape segment between said plurality of substantially longitudinally extending bussing leads and said semiconductor die.

27. The method of claim 26, further including:

wire bonding a plurality of said plurality of inwardly extending leads to a plurality of said plurality of bond pads.

28. The method of claim 26, further including:

wire bonding a plurality of said plurality of substantially longitudinally extending bussing leads to a plurality of said plurality of bond pads.

29. The method of claim 26, further including:

packaging at least a portion of said plurality of inwardly extending leads and said semiconductor die.

30. The method of claim 29, further including:

attaching a plurality of said plurality of inwardly extending leads to a circuit of a computer.

31. A method of manufacturing a semiconductor device connected to a hybrid lead frame, said method comprising the steps of:

forming a hybrid lead frame having a plurality of inwardly extending leads, said plurality of inwardly extending leads defining a die position, having a first and second end and having a plurality of substantially longitudinally extending bussing leads between said first end and said second end of said lead frame and across at least a portion of said die position, at least one of said plurality of substantially longitudinally extending bussing leads formed to have at least one intermediate angled portion; and attaching at least one tape segment between at least two of said plurality of substantially longitudinally extending bussing leads proximate distal ends of said at least two of said plurality of substantially longitudinally extending bussing leads.

32. The method of claim 31, further including:

maintaining said plurality of substantially longitudinally extending bussing leads in position relative to each other by securing said plurality of substantially longitudinally extending bussing leads with said at least one tape segment.

33. The method of claim 31, further including:

providing a semiconductor die having a plurality of bond pads on an active surface and positioning said semiconductor die relative to said lead frame at said die position.

34. The method of claim 33, further including:

attaching said semiconductor die to said plurality of substantially longitudinally extending bussing leads at said die position.

35. The method of claim 34, further including:

attaching said semiconductor die to said plurality of substantially longitudinally extending bussing leads by adhesively attaching said semiconductor die to said plurality of substantially longitudinally extending bussing leads.

36. The method of claim 35, further including:

attaching said semiconductor die to said plurality of substantially longitudinally extending bussing leads by providing at least one longitudinally extending tape segment between said plurality of substantially longitudinally extending bussing leads and said semiconductor die.

37. The method of claim 36, further including:

wire bonding a plurality of said plurality of inwardly extending leads to a plurality of said plurality of bond pads.

38. The method of claim 36, further including:

wire bonding a plurality of said plurality of substantially longitudinally extending bussing leads to a plurality of said plurality of bond pads.

39. The method of claim 38, further including:

packaging at least a portion of said plurality of inwardly extending leads and said semiconductor die.

40. The method of claim 39, further including:

attaching a plurality of said plurality of bussing leads to a circuit of a computer.

* * * * *

UNITED STATES PATENT AND TRADEMARK OFFICE
CERTIFICATE OF CORRECTION

PATENT NO. : 6,146,922
DATED : November 14, 2000
INVENTOR(S) : Brooks et al.

It is certified that error appears in the above-identified patent and that said Letters Patent is hereby corrected as shown below:

Column 4,
Line 2, after "semiconductor" insert -- memory --;
Lines 48 and 49, after "tape" insert -- strip --; and Column 5,
Line 24, delete "may be" (second duplicate occurrence).

Column 6,
Line 53, after "one" insert -- substantially longitudinally extending --;

Column 7,
Line 23, before "lead frame" insert -- hybrid --;
Line 54, after "least" insert -- one --;
Line 55, after "extending" delete "one";

Column 8,
Line 5, after "inwardly" insert -- extending --;
Line 46, after "plurality" insert -- of --;
Line 47, after "extending" delete "of";

Column 9,
Lines 9 and 28, before "lead frame" insert -- hybrid --; and

Column 10,
Line 26, before "bussing" insert -- substantially longitudinally extending --.

Signed and Sealed this

Eleventh Day of March, 2003

JAMES E. ROGAN
*Director of the United States Patent and Trademark Office*